United States Patent [19]
Fischer

[11] 3,989,953
[45] Nov. 2, 1976

[54] STORAGE ELEMENT FOR A DIGITAL PERMANENT STORAGE (MEMORY SYSTEM)

[75] Inventor: Dieter Fischer, Frankfurt am Main, Germany

[73] Assignee: Battelle-Institut e.V., Frankfurt am Main, Germany

[22] Filed: Aug. 27, 1975

[21] Appl. No.: 608,259

[30] Foreign Application Priority Data
Aug. 27, 1974 Germany.......................... 2440907

[52] U.S. Cl..................... 307/88 ET; 340/173 PL; 340/173 PP; 340/324 M
[51] Int. Cl.² ........................................ G11B 9/00
[58] Field of Search........... 307/88 ET; 340/173 PP, 340/173 PL, 173 LS, 173.2, 324 M

[56] References Cited
UNITED STATES PATENTS

| | | | |
|---|---|---|---|
| 3,268,331 | 8/1966 | Harper | 340/173 PP |
| 3,276,031 | 9/1966 | Gaynor | 340/173 PP |
| 3,400,383 | 9/1968 | Meadows et al. | 307/88 ET |
| 3,543,248 | 11/1970 | Oliver | 307/88 ET |
| 3,942,029 | 3/1976 | Kawakami et al. | 307/88 ET |

*Primary Examiner*—Marshall M. Curtis
*Attorney, Agent, or Firm*—Fisher, Christen & Sabol

[57] ABSTRACT

A storage element for a digital permanent storage system having a field effect transistor, the semiconductor layer of the field effect transistor being changeable in its electrical conductivity in dependence on the state of the storage of a storage medium. The storage medium consists of an electret foil, a field effect transistor which is located on one side of the electret foil and which has been applied directly using the thin-film technique, and a glow gap on the opposite side of the electret foil. The glow gap is disposed in such a way, that in case of its ignition, depending on the polarity of the ignition voltage, the state of the charge on the side of the electret foil facing the glow gap is changed as a result of which the electrical field penetrating the semiconductor layer of the field effect transistor is changed and thus the conductivity of the semiconductor layer is changed.

3 Claims, 9 Drawing Figures

STORAGE ELEMENT FOR A DIGITAL PERMANENT STORAGE (MEMORY SYSTEM)

BACKGROUND OF THIS INVENTION

1. Field of This Invention

This invention relates to a storage element for a digital permanent storage (memory) system, which has as an essential component a field effect transistor the semiconductory layer of which is changeable in its electrical conductivity, depending on the state of the storage of a storage medium.

2. Prior Art

A fairly large number of physical phenomena have been known upon the basis of which one could build systems for the purpose of digital storage of information. Some such systems have already been realized. All systems for erasable mass storage systems used in practice hitherto are based however on the principle of magnetic remanence. Within the last few years, a series of new storage methods have been described which have been somewhat intensively developed. Every one of these technological systems has its special advantages and attractive features, which predestines it for special areas of application. However, these advantages are countered by disadvantages, such as, special working conditions (e.g., low temperatures), special methods of operation (e.g., shift registers) or the necessity of extensive external apparatus for control (e.g., optical storage systems).

The possibilities resulting from physics and technology of a part of these storage methods suggest a subdivision into mass storage systems and rapid storage systems is regard to their areas of application. The former generally speaking are holographic systems which have the goal of random access to quantities of date of more than $10^{10}$ bits without intermediate mechanical movement. Rapid storages on the other hand in most cases are integrated semiconductor systems, the access and transfer times of which lie within the nanoseconds range. Generally speaking however, these are not permanent storage systems so that their area of application lies more in the area of the short time storage of relatively small quantities of data.

Between these two extremes, there are a number of processes in development which are projected to have the storage capacities of about $10^8$ bits and which have operating times of the order of magnitude of 1 $\mu s$[R.E. Matick, Proc. IEEE 60, 3, p. 226 (1972)]. Development of the so-called "magnetic bubble" storage system is quite advanced, which in the case of use of permanent magnets is a genuine permanent storage. One disadvantage of such storage system is the shift register operation. In the case of construction of fairly large storage systems, the length of the register must be relatively large for no other reason than because of the cost. In the case of shift frequencies of from 0.1 to 4 × $10^6$ bits, average access times of 0.1 to 1 ms result ]F. Perzefall, Elektronic 2, p. 39 (1974)]. Furthermore, to mention a few, the semipermanent MNOS-system [K. E. Lundstrom, and C. M. Svensson, IEEE Trans. of Electronic Devices 19, 6, p. 826 (1972)] and storage systems based on the principle of electronic delay lines [R. M. White, Proc. IEE 58, p. 1238 (1970)] are also under development.

In the case of optically addressed storages systems which utilize, for example the Faraday or Kerr effect on ferromagnetic or ferroelectrical material, there is a lack of suitable light deflectors which cannot approach a sufficiently large number of discrete positions without mechanical intermediate movement.

Several years ago, storage elements were described which were founded on the basis of ferroelectricity. [J. L. Moll and Z. Tarni, IEEE Trans. Electr. Devices vol. ED-14, No. 10, p. 338 (1963); S. S. Perlman and K.-H. Ludewig, IEEE Trans. Electr. Devices vol. ED-14, p. 816 (1967); G. G. Teather and L. Young, Sol. State Electron Devices vol. 11, p. 527 (1968); J. C. Crawford and F. L. English, IEEE Trans. Electron. Devices vol. ED-16, No. 6, p. 525 (1969)]. Their development slackened however because of obviously insurmountable material problems (badly defined coercive force, fatigue of the switchable charge, slow switching processes, etc.). Such ferroelectrical storage elements also consist basically of a field effect transistor which is placed onto the storage medium. The electrical resistance of the transistor semiconductor layer than depends on the polarization of the electrical field of the ferroelectricum (ferroelectric medium), which in turn is determined by the state of the storage element. However, such constructions elements have the basic disadvantage that the remanent polarization disappears within a few weeks — so such systems are not immediately suitable for permanent storages. R. R. Metha, B. D. Silverman and J. T. Jacobs, J. Appl. Phys., vol. 44, no. 8, p. 3379 (1973), comes to the conclusion that the depolarization is traceable back to the fact that, because of difference in the postion of the center of mass of the ferroelectrical polarization charges and of the free compensation charges, opposing electrical fields fold back the ferroelectrical domains.

BROAD DESCRIPTION OF THIS INVENTION

An object of this invention is to provide a storage element for a digital permanent storage system where the storage condition is maintained for what in essence is a permanent basis (i.e., very long period of time). Another object of this invention is to provide a storage element for a digital permanent storage system that has a high storage density and a short access time. A further object of this invention is to provide a digital permanent storage system which is simple and economical to construct. Other objects and advantages of this invention are set out below or are obvious to one ordinarily skilled in the art from this specification.

Such objects and advantages are achieved by this invention.

This invention is based on the task of creating a storage element for a digital permament storage system whereby the storage condition is maintained for a sufficiently long period of time (i.e., permanent storage). Furthermore, as simple as possible construction of the total storage system in an economic manner has been desired, which includes also the demand for a simple write-in, reading and erasing of the information, which alternately can be carried out with simple means. High storage densities and short access times should also be guaranteed.

These tasks can be solved by a surprisingly simple and very technically advanced manner with the storage element of this invention. This invention involves a storage element, wherein the storage medium includes an electret foil which has a field effect transistor on one surface. The field effect transistor was mounted directly using the thin-film technique. A glow gap is present on the opposite side of the electret foil. The glow gap is disposed in such way that in the case of its ignition, depending on the polarity of the ignition voltage, the state of the charge on the side of the electret foil facing it is changed, as a result of which the electrical field penetrating into the semiconductor layer of the field effect transistor changes and thus the conductivity of the semiconductor layer of the transistor changes.

With the storage element according to this invention, a so-called "random -access" permanent storage system can be constructed wherein an electret foil serves as the storage medium. The writing (entry) and erasing is accomplished by microplasm discharges with the help of the glow gap present in every storage element. At the same time charges are applied to or neutralized on the one surface of the electret foil — as a result of which the electrical field emerging on the opposite surface and penetrating into the adjoining transistor is controlled. This electrical field directly influences the electrical resistance of the semiconductor layer of the thin-film transistor, the source-drain-resistance of which gives the storage state of the storage element. The read-out then takes place statically. The writing and reading systems can be approached independently of one another. In the case of an approach by way of selector matrices, very few external connections are needed. The times required for writing and reading, especially also the access times, in the case of the use of storage elements according to this invention is about 1 $\mu$sec. The storage density is limited essentially by the possibilities of the thin-film technique and is about $10^4$ to $10^5$ bits/cm$^2$. Since relatively thin single storage element can be produced, storage densities of $10^6$ bits/cm$^3$ are achieved by stacking them.

Further characteristics, advantages and possibilities of application of this invention are clear from the succeeding explanation and from the attached drawings.

DETAILED DESCRIPTION OF THIS INVENTION

For a better understanding of the method of operation of the storage element according to this invention, first a few characteristics of electrets are explained in more detail. In the case of the electrets, which have been improved considerably during the last few years by use of suitable plastics, in most instances so-called space charge electrets are being dealt with. All dielectric materials contain a certain number of free electrical charge carriers, that is ions, electrons, or both. Normally, these free electrical charge carriers are seated in deep energy traps, and are distributed statistically, so that no resulting electrical field occurs on the outside. By heating the plastic, these charge carriers however can be freed thermally from their traps and then moved to the corresponding electrodes by application of an outside electrical field, where they collect (seat) at the border surfaces. As a result of cooling the dielectric material while the field being maintained, this condition is frozen, that is to say the charge carriers are again located in deep traps from which they can be freed only by the addition of a certain amount of energy. These are several production (formation) methods for electrets — the charge carriers can also be supplied from the outside , such as, by means of bombardment with electron beams, by way of liquid contracts or by gas discharge.

FEP (polyfluoroethylene propylene) is particularly suitable (preferred) for the production of the electret foil. Charge densities using FEP are of about $10^{-7}$As /cm$^2$. Electrets constructed of FEP are stable to bout 80° C. Extrapolation was carried out from corresponding measurements so that the charge at relatively low humidity and about 25° C. would be maintained for about 200 years. Any electret of the proper type can be used. (An electret foil is a foil of a dielectric material in which a permanent state of electrostatic polarization or a trapped space charge has been set up. Only the second kind of electret is suitable for preparing of the storage element according to this invention.)

Figure 1:
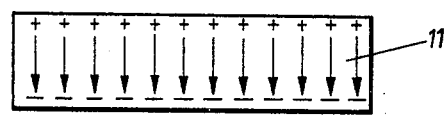
FIG. 1 is a schematic drawing of the course of the electrical field in an electret; p

As FIG. 1 shows in the case of the absence of outside electrodes, the field (produced by the charge) is closed in the inside of the electret, that is to say no field occurs toward the outside. In the case of the stated density of the charge (sigma) $\sigma = 10^{-7}$ As/cm$^2$, in the case of the dielectricity constant $=2$, of the influence constant $\epsilon_o= 8.8 \times 10^{-14}$ the field prevailing in the inside is $$E = \frac{\sigma}{\epsilon \epsilon_o} = \frac{10^{-7}}{2 \times 8.8 \times 10^{-14}} = 5 \times 10^5 \ \frac{V}{cm}$$

Figure 2:
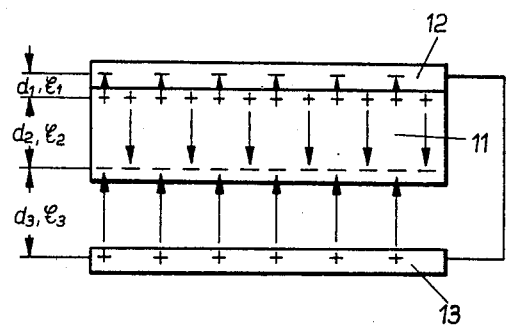
FIG. 2 is a schematic drawing of the course of the electrical field in an electret that is being influenced by conductive plates disposed outside thereof in a particular manner.
Figure 3:
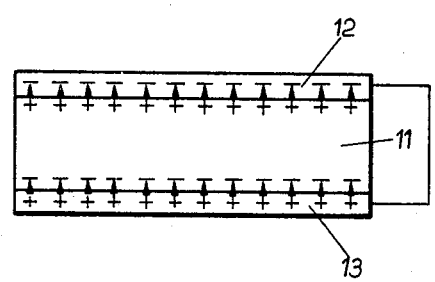
FIG. 3 is a schematic drawing of the course of the electrical field in an electret that is being influenced by conductive plates disposed outside thereof in a particular manner.

Whenever the electret is moved according to FIG. 3 between two conductive or semiconductive plates (12 and 13), then influence charges will be produced there. In case the distance of these plates from the corresponding surface of the electret is sufficiently small, then almost the entire field can be withdrawn to the outside, however only up to the break down intensity of the surrounding gas. After removal of plates 12 and 13, the field again is closed or restricted to the inside of the electret. The latter is also true whenever only one of the two plates 12 and 13 are removed. This can be deduced from the following consideration on the basis of FIG. 2.

The plates have a distance $d_1$ or $d_3$ in relation to the surface of the electrode and are interconnected on the outside, so that a closed circle is formed; in that case $$\oint \vec{E} \, \vec{ds} = 0 \tag{1}$$

is valid, or $$E_1 d_1 - E_2 d_2 + E_3 d_3 = 0$$

Assuming the charge density on the electret is $\sigma_o$, the charge densities influenced on the plates are equal on both plates ($= \sigma_m$). Then it follows:

$$\frac{\sigma_M}{\epsilon_o} d_1 - \frac{\sigma_o - \sigma_M}{\epsilon \epsilon_o} d_2 + \frac{\sigma_M}{\epsilon_o} d_3 = 0$$

$$\rightarrow \sigma_M = \frac{\sigma_o d_2}{d_2 + \epsilon(d_1 + d_3)} \quad (2)$$

For $d_3 >> d$, and $d_2 \rightarrow 5_m \approx 0$. This determination is essential for the functioning of the storage element according to this invention.

The basic structure of a storage element of the type according to this invention is shown by FIGS. 4 to 7. On the upper side of electret foil 11, a field effect transistor (14 to 17), which is produced by a thin-film technique, has been placed directly thereon, so that it can be controlled directly by the field of the electret charge. Source and drain of transistor 14 to 17 are numbered 15 and 17, respectively, and the gate connection by 16. On the lower side of electret foil 11, there is a glow gap comprises of electrodes 18 and 19, which serves for the writing in and erasing of the information.

Figure 4:
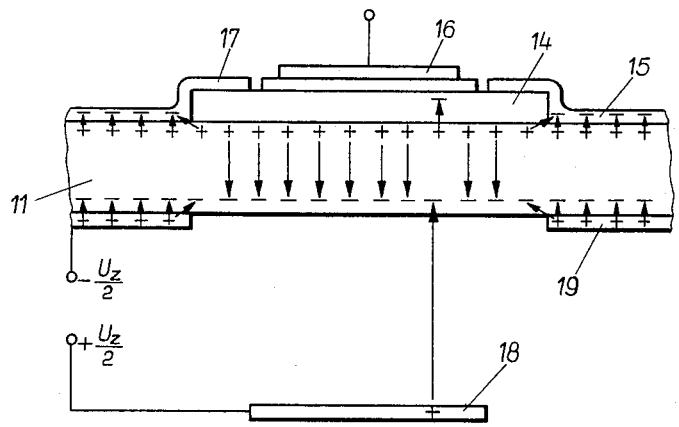
FIGS. 4 to 6 are a set of schematic drawings of an embodiment of the storage element according to this invention which show the course of the lines of flux, or the charge distribution, in the case of a different storage state.

In the case of the state of the storage element according to this invention shown in FIG. 4, the negative charge of electret foil 11 has no counter charge, so that the field exists almost only on the inside of the electret foil 11. As a result of that, only a negligibly small charge is influenced in semiconductor layer 14 of transistor 14 to 17. Let this be the conductive state of doped semiconductor layer 14. The electret charges located in the marginal zones of the element are neutralized by the metallic conductors of cource 15 and drain 17 and of the glow electrode 19 which is located directly on the surface, and can be disregarded in the following discussions.

Figure 5:
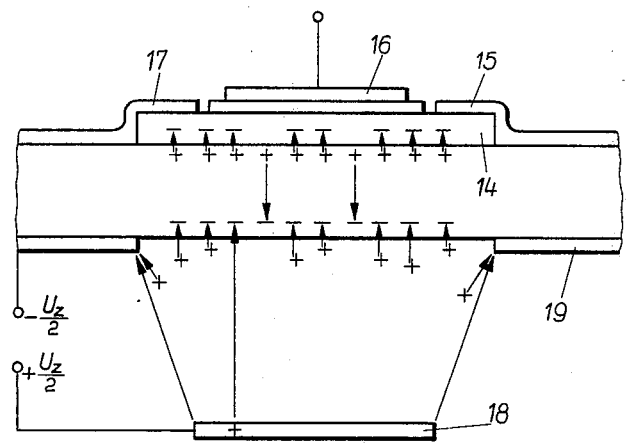

FIG. 5 shows the writing in of the information by application of positively charged ions onto the lower electret foil surface, which takes places as a result of ignition of the glow discharge in case of corresponding polarization. In this case and in case of a sufficient approach, the negative electret charges also act on the positive ions of the glow discharge, so that a part of these ions is accelerated toward the electret surface, whereby an electrical double layer develops. Thus, according to equation (2), the distances $d_1$ and $d_3 << d_2$ and thus $\delta_m = \delta_o$ are influenced, that is to say in semiconductor layer 14 approximately the same charge density is influenced as is present in electret foil 11. These charges cause a change of the charges present in semiconductor 14, as a result of which the resistance of this layer changes.

The following explanations show that voltages of about 30 to 50 volts are sufficient in order to ignite the discharge.

In this respect see FIG. 2. The metal place is removed a distance from the electret which corresponds about to the lower electrode of the glow gap in FIGS. 4 to 7. In that case, there will be a field or a voltage between the electret and the electrode:

$$E_3 = \frac{\sigma_M}{\epsilon_o}$$

or a voltage:

$$U_3 = \frac{\sigma_M}{\epsilon_o} d_3 \quad (3)$$

Insertion of (2) and (3) results in:

$$U_3 = \frac{\sigma_o d_2 d_3}{\epsilon_o [d_2 + \epsilon(d_1 + d_3)]}$$

or because of $d_1 << d_3$ $$U_3 = \frac{\sigma_o}{\epsilon_o} \times \frac{d_2 d_3}{d_3 + \epsilon d_3} \quad (4)$$

Figure 8:
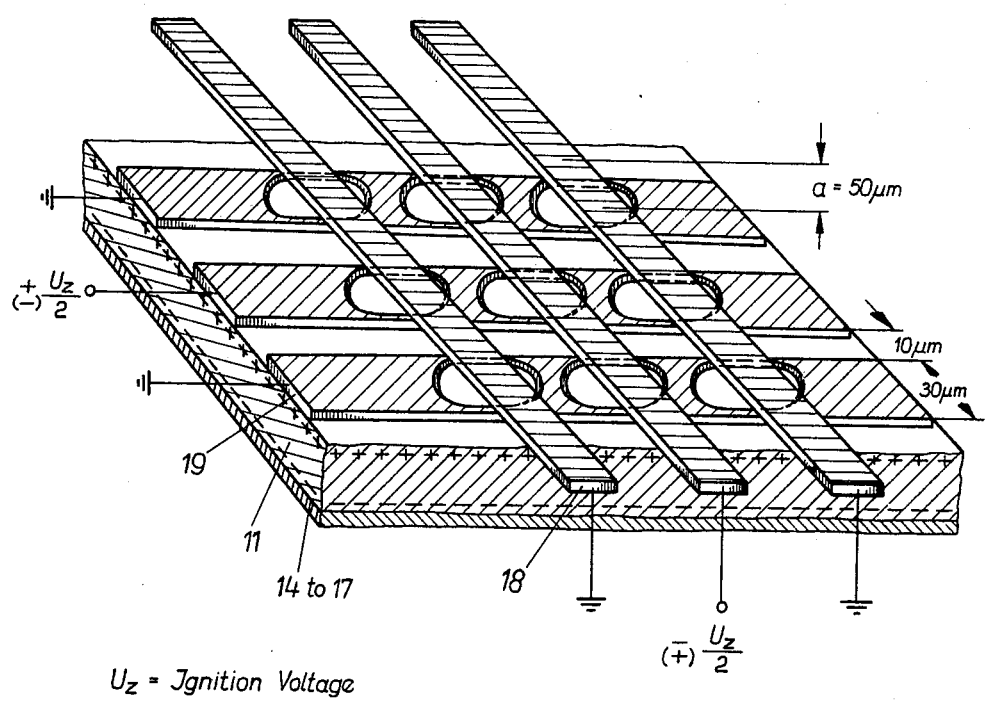
FIG. 8 is a perspective view, partially cut away, of a storage matrix having storage elements of the type according to this invention.

FIG. 8 illustrates this relationship $U_3 = f(d)_3$ with $\sigma_o$ and $d_2$ as parameters. This illustration is taken from G. M. Sessler and J. E. West, Rev. Sci. Inst. 42, 1, p. 15 (1971). The Paschen curve drawn-in represents a marginal curve (border curve), above which a field intensity of break down electric field strength of the area is surpassed at 760 torr. In the case of a predetermined charge density of the electret, one can therefore easily find a "work point" by suitable selection of the distance $d_3$ as well as of the type of gas and of the gas pressure, at which point the field produced by the electret in the air gap $d_3$ is not yet sufficient in order to ignite a discharge. Ingition is then accomplished by the application of an additional field between the two electrodes 18 and 19 of the glow gap. The voltages required for this can be lower the closer the above mentioned operating point lies to the Paschen curve. This approach must not be too great in order to avoid an automatic breakdown.

The reading of the information consists of interrogating he resistance of semiconductor layer 14. Therefore the ratio of the resistors in both states is to be as large as possible.

Transistors of the enhancement type can be used for this purpose which are open in the case of the absence of a gate voltage and are locked through application of a positive or negative gate voltage depending on the type of the semiconductor.

The interrogation of the information can take place in two different ways, namely:
  a. At gate 16 of transistor (14 to 17), there is no voltage. The polarity of the influence charge produced by the electric foil 11 in semiconductor 14 is such, that the resistance of the semiconductor is increased. Then, a high resistance between source 15 and drain 17 signifies the presence of information;
  b. At gate 16 of transistor (14 to 17), such a voltage is applied that the source-drain section is blocked. Let the polarity of the influence charges produced by the electret 11 be reversed, but the amount of be approximately equally as large as the influence charges produced by the gate. Thus, the transistor blocked from the direction of the gate is again opened from the direction of the electret. Then a low resistance signifies the presence of information.

As shown in the following paragraphs, case (b) is more favorable for the approach of a storage built up from many individual elements.

In order that the blocking take place in the case of a gate voltage favorable for the integrated circuits, the semiconductor material must be suitably doped or selected. In the case of a gate voltage of for example 2 volts, one can calculate on the basis of the simple formula for the plate capacitor, that in the case of an insulator thickness (between gate 16 and semiconductor 14) of 500 A and a DK (dielectric constant) of maximally 5, approximately $10^{12}$ charges per cm$^2$ can be displaced. Whenever the semiconductor contains such a number (or less) of free charges per cm$^2$, it can then be fully blocked. In the case of a thickness of the semiconductor of about 200 A, there results from this a doping of about $0.5 \times 10^{18}$ cm$^{-3}$. This doping range is accesible with the semiconductors of tellurium and SnO, and also PbS, which can be produced by relatively simple vapor deposition processes.

The abovementioned number of $10^{12}$ charges per cm$^2$ corresponds to a charge density of $1.6 \times 10^{-7}$ cb/cm$^2$. This however corresponds approximately to the charge density which can also be reached on the electret, so that the interrogation of the information can take place as described under case (b).

In the case of registration of the information according to FIG. 5, the lower electret foil charge is neutralized, that is to say it becomes inactive toward the outside. The upper electret foil charge now acts like a monocharge. Because of the geometrical proximity to semiconductor 14 (distance $d_1$), an almost equally large charge with the reverse sign is being influenced there. A low charge quantity however is influenced also in this case on lower glow electrode 18 (distance $d'_3 = d_2 + d_3$). Therefore, there is a voltage of:

$$U'_3 = \frac{\sigma_o}{\epsilon_o} \times \frac{d_1 d'_3}{d_1 + d'_3} \qquad (5)$$

between the upper electret charge and lower glow electrode 8.

By a suitable slection of the geometry one will achieve that $U'_3 = -U_3$ is valid, so that now by reversal of the polarity of the voltage between the electrode 18 and 19 of the glow gap (FIG. 6) a discharge in the reverse direction form the above case is ignited, as a result of which the starting state corresponding to FIG. 4 is again re-established. Erasure of the information takes place in this manner.

This type of ignition of glow discharges is used as a matter of fact in a similar manner in the case of the so-called "ac plasma panels". [P. H. Haberland, J. Vac. Sci. Technol. vol. 10, No. 5, p. 796 (1973); R. L. Johnson, D. L. Blitzer and H. G. slowott, IEEE Trans. Electron, Devices 18, 9, p. 642 (1971); L. F. Weber and R. L. Johnson, IEEE Trans. Electr. Devices 10, 11, p. 1082 (1973)]. There, matrix arrangements of glow discharges are used as flat fluoroscopes.

The storage elements according to this invention are put together in matrix arrangements to achieve storage systems. The writing and erasing system which is formed by the glow gaps, and the reading system on the transistor side are separated from one another by electric foil 11 and can therefore be controlled independently of one another.

FIG. 8 shows a cut away of a storage matrix containing a few joined storage elements of the type according to this invention. In such illustration, the writing and erasing system is on the top side, which consists essentially of electrodes 18 and 19 that are series connected by lines and columns. Below that is electret foil 11, and below electret foil 11 are field effect transistors 14 to 17 (assigned to each individual element, the individual components of which are not shown in FIG. 8).

The individual storage elements can be approached directly (random access) with a coincidence circuit. Electrode strips 18, which have been vapor-deposited on electret foil 11, are perforated in the area of each individual storage element, so that the charge carriers of the glow discharge have access to the electret surface; each perforation therefore presents a storage place. Such an arrangement can be produced with the thin-film technique, whereby a density of more than $10^4$ glow gaps/cm$^2$ creates no difficulties.

Figure 6:
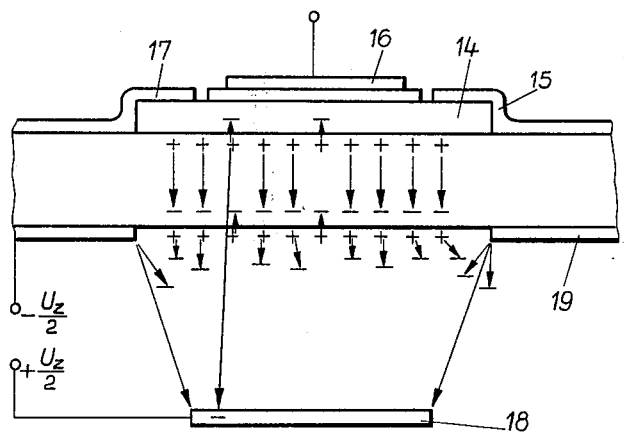
Figure 7:
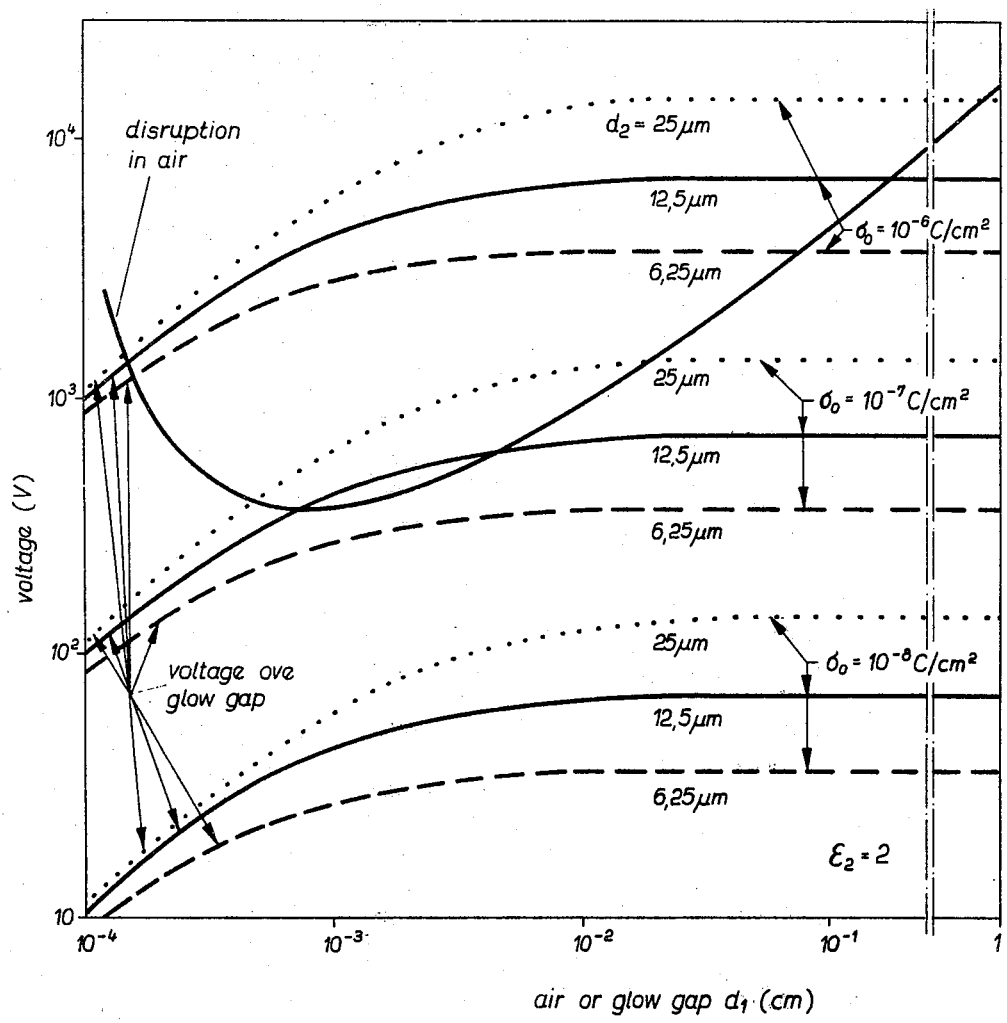
FIG. 7 is a diagram of the dependence of the voltage between an electret and an outside electrode based on the air gap between the two.

The individual electrode strips 18 and 19 in one embodiment of this invention given by way of example have a width of about 30 $\mu$m to 50 $\mu$m; the distance $a$ between the electrodes 8 and 9 of the glow gap, see in this respect also FIGS. 4 to 6, likewise lies at about the order of magnitude of 30 $\mu$m to 50 $\mu$m.

Figure 9:
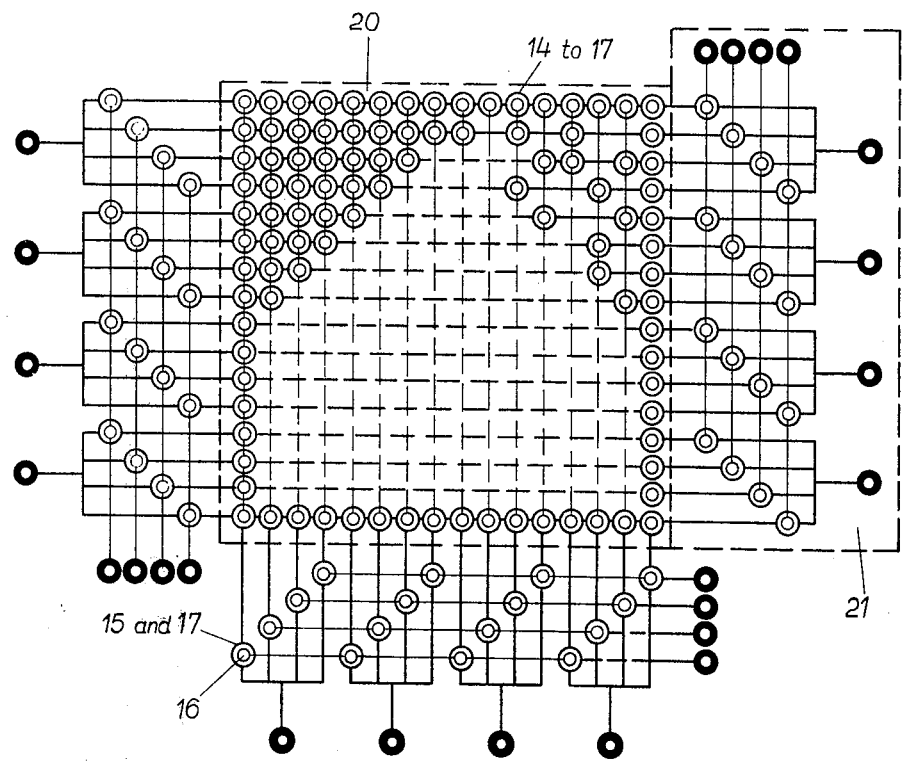
FIG. 9 is a schematic diagram of the connection of the transistors of a storage matrix of the type according to this invention for reading the information.

A basic sketch of the construction of the circuit for reading the information is shown in FIG. 9. A thin-film transistor (14 to 17) is located at every storage place in the case of storage matrix 20 on the sides of electret foil 11 opposite the writing the erasing system. The transsitors are series connected by way of their connections 15 and 17 by lines — "gates" 16 are series connected by columns. The approach of a certain storage element in this case takes place in accordance with the principle of the coordinate switch. If a storage cell carries information, then the transistor which is conductive already in the starting state is opened still further. Thus, in the case of the absence of a gate voltage, all transistors (14 to 17) of storage matrix 20 are in a conductive state.

The interrogation of the storage content of a certain element now takes place by the application of a voltage to the corresponding gate gap and by measurement of the cross current through the transistor cell in which the element is located. If the element carries no information, then the transistor is blocked by the gate voltagr and no cross current flows. Whenever the element does carry information, then the transistor remains opened and cross current does flow, the magnitude of which is determined by the sum of the resistances of the transistors series connected in one line. In order to be able to differentiate the two states clearly, this on/off ratio must be as large as possible. The resistance ratio of $10^5 : 1$, which can be achieved signifies that higher than $10^4$ elements can be series connected in one line.

It is further shown in FIG. 9, that the approach of storage matrix 20 takes place in this case by way of selector matrices 21, which likewise are constructed as thin-film transistors and can be produced simultaneously with the reading transistors on the same surface. Thus, only a few external connections are necessary for the approach.

With the storage element constructed in the manner according to this invention, one can therefore construct permanent storages which are technically very advanced. As has been known from the "ac-plasma-panels" already mentioned previously, a time of 2 to 3 $\mu$s is used for writing in and erasure of an element. The access time to a certain storage cell is determined by the switching time of the thin-film transistors and likewise lies in the order of magnitude of 1 $\mu$s. Writing in or erasure or reading can take place simultaneously and independently of one another. Since moreover any arbitrary cell or any arbitrary storage element can be approached independently, a very effective organization of the entire storage device is possible.

Since glow discharges can be produced on a very small space, the number of storage places per cm$^2$ is predetermined essentially by the possibilities of the thin-film technique; a density between $10^4$ and $10^5$ elements per cm$^2$ is obtainable. The base plate that is to be used for the construction of a storage can be kept relatively thin; therefore one can achieve a high storage capacity per volume unit by stacking such plates. In the case of a plate thickness of 0.5 to 1 mm, a storage capacity of about $10^6$ bits/cm$^3$ is obtained. Such a capacity can be surpassed only by optical storages, which however require bulky, very complicated external devices for the approach of the storage medium.

What is claimed is:

1. A storage element for a digital permanent storage system having a field effect transistor, the semiconductor layer of said field effect transistor being changeable in its electrical conductivity in dependence on the state of the storage of a storage medium, characterized in that said storage medium consists of an electret foil, a field effect transistor which is located on one side of said electret foil and which has been applied directly using the thin-film technique, and a glow gap on the opposite side of said electret foil and which is disposed in such a way, that in case of its ignition, depending on the polarity of the ignition voltage, the state of the charge on the side of said electret foil facing said glow gap is changed as a result of which the electrical field penetrating said semiconductor layer of said field effect transistor is changed and thus the conductivity of said semiconductor layer is changed.

2. A storage element as claimed in claim 1 wherein said electret foil is constructed of polyfluoroethylene propylene.

3. A storage element as claimed in claim 1 wherein said field effect transistor is vacuum evaporated on said one side of said electret foil.

* * * * *